(12) United States Patent
Chatroux et al.

(10) Patent No.: US 9,322,867 B2
(45) Date of Patent: Apr. 26, 2016

(54) DETECTION OF AN INSULATION DEFECT

(75) Inventors: Daniel Chatroux, Teche (FR); Sebastien Carcouet, Vif (FR); Julien Dauchy, Chatte (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 137 days.

(21) Appl. No.: 14/122,803

(22) PCT Filed: Jun. 1, 2012

(86) PCT No.: PCT/EP2012/060395
§ 371 (c)(1),
(2), (4) Date: Dec. 16, 2013

(87) PCT Pub. No.: WO2012/164073
PCT Pub. Date: Dec. 6, 2012

(65) Prior Publication Data
US 2014/0103939 A1    Apr. 17, 2014

(30) Foreign Application Priority Data

Jun. 1, 2011 (FR) ..................................... 11 54849
Jun. 1, 2011 (FR) ..................................... 11 54850

(51) Int. Cl.
*G01R 31/02* (2006.01)
*G01R 31/12* (2006.01)
(Continued)

(52) U.S. Cl.
CPC ......... *G01R 31/1272* (2013.01); *B60L 11/1803* (2013.01); *G01R 27/18* (2013.01); *G01R 31/025* (2013.01); *Y02T 10/7005* (2013.01)

(58) Field of Classification Search
USPC ......... 324/503, 509, 510, 426, 551, 500, 523, 324/541, 606, 713; 361/42, 56, 57, 79; 320/107, 134, 136, 137, 162; 363/21.01
See application file for complete search history.

(56) References Cited

U.S. PATENT DOCUMENTS

| 5,818,236 A | 10/1998 | Sone et al. |
| 6,992,490 B2 * | 1/2006 | Nomoto et al. ............... 324/522 |

(Continued)

FOREIGN PATENT DOCUMENTS

| EP | 0654673 | 5/1995 |
| EP | 1289094 | 3/2003 |

(Continued)

OTHER PUBLICATIONS

Lu et al. "A High-voltage safety protection method for electric vehicle based on FPGA", Vehicular Electronics and safety, IEEE International Conference XP031177221 pp. 26-31 (2006).

*Primary Examiner* — Benjamin M Baldridge
*Assistant Examiner* — Nasima Monsur
(74) *Attorney, Agent, or Firm* — Occhiuti & Rohlicek LLP

(57) ABSTRACT

An electrical power supply device includes a DC voltage source with terminals, a controller, and an insulation-defect detecting device for detecting an insulation defect of the voltage source. The device has input terminals connected to source terminals, and circuits connected between respective input terminals and an intermediate point. The insulation-defect current-detection circuit connects between ground and the intermediate point. Both circuits have current-limiter circuits that open and close a connection between respective inputs and the intermediate point. Both current-limiter circuits are rated for traversal by a current of less than a standardized safety threshold when the first current-limiter circuit is closed and one of the terminals of the DC voltage source is shorted to ground. The control circuit is configured to simultaneously keep one current-limiter circuits open and the other closed.

15 Claims, 6 Drawing Sheets

(51) Int. Cl.
*G01R 27/18* (2006.01)
*B60L 11/18* (2006.01)

(56) References Cited

U.S. PATENT DOCUMENTS

| | | | |
|---|---|---|---|
| 8,289,031 B1 * | 10/2012 | Rao | 324/551 |
| 2003/0234653 A1 | 12/2003 | Kollenda et al. | |
| 2004/0212371 A1 | 10/2004 | Nomoto et al. | |
| 2005/0146335 A1 * | 7/2005 | Wild | 324/510 |
| 2006/0158197 A1 * | 7/2006 | Horikoshi et al. | 324/551 |
| 2007/0285057 A1 | 12/2007 | Yano | |
| 2008/0158756 A1 * | 7/2008 | Lindsey et al. | 361/88 |

FOREIGN PATENT DOCUMENTS

| | | |
|---|---|---|
| EP | 1857825 | 11/2007 |
| EP | 2333568 | 6/2011 |
| JP | 8163704 | 6/1996 |
| WO | WO2008/088448 | 7/2008 |
| WO | WO2009/043772 | 4/2009 |

* cited by examiner

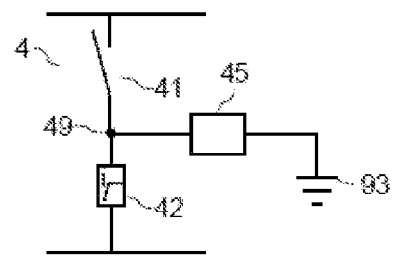
Fig. 3
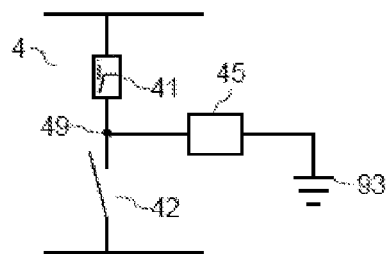
Fig. 4
Fig. 5
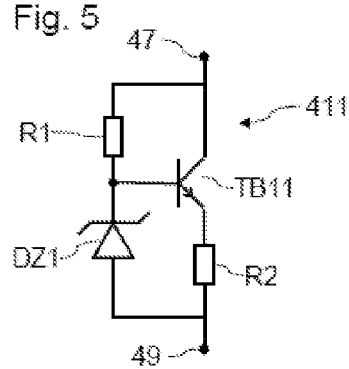
Fig. 6
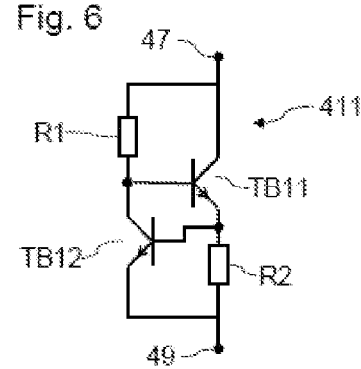
Fig. 7
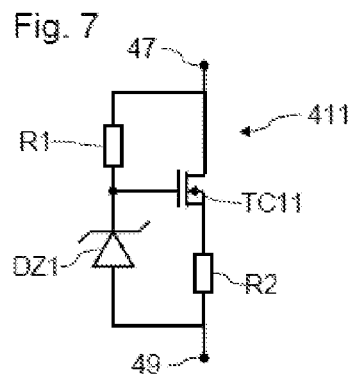
Fig. 8
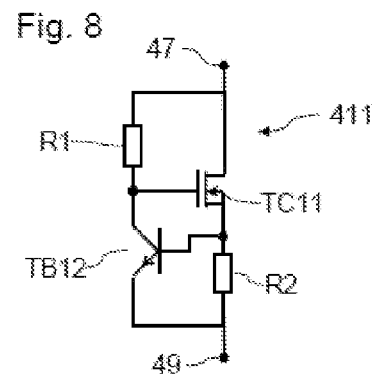

DETECTION OF AN INSULATION DEFECT

RELATED APPLICATIONS

Under 35 USC 371, this application is the national stage entry of PCT/EP2012/060395, filed on Jun. 1, 2012, the content of which is herein incorporated by reference, and claims the benefit of the priority date of French Application 1154849 filed on Jun. 1, 2011 and French Application 1154850 filed on Jun. 1, 2011.

FIELD OF DISCLOSURE

The invention relates to the insulation of a DC voltage electrical power supply or a network with respect to the ground.

BACKGROUND

High-power DC voltage electrical systems are undergoing significant development. Indeed, numerous transport systems include a DC voltage supply.

Hybrid combustion/electric or electric vehicles include, in particular, high-power batteries. To obtain the appropriate voltage level, several electrochemical accumulators are placed in series. To obtain high powers and capacities, several groups of accumulators are placed in series. The number of stages (number of groups of accumulators) and the number of accumulators in parallel in each stage vary as a function of the desired voltage, current and capacity of the battery. The association of several accumulators is called a "battery of accumulators." The electrochemical accumulators used for such vehicles are generally of the lithium ion type for their capacity to store significant energy with a confined weight and volume. Battery technologies of lithium-ion iron phosphate $LiFePO_4$ type form the subject of significant developments on account of a high intrinsic safety level, to the detriment of a somewhat restrained energy storage density.

Such batteries are used to propel an AC electric motor by way of an inverter. The voltage levels necessary for such motors reach several hundreds of volts, typically of the order of 400 volts. Such batteries also comprise a high capacity so as to favor the autonomy of the vehicle in electric mode. Several technical reasons specific to the automobile application lead to the use of insulation between the vehicle's mechanical mass (formed by the vehicle's metal chassis and metal body-shell, and therefore accessible to the user) and the potentials of the battery. The main reason is that it is not conceivable upon a first insulation defect while driving to instantaneously disconnect the traction battery. For example, in the case where one of the poles of the battery is linked to the mechanics while the insulation defect appears on the other pole. This is manifested by a short-circuit and the immediate fusing of the protection fuse. This would have the effect of rendering the vehicle dangerous. On account of the disappearance of traction power or of recuperative braking, this therefore makes it obligatory to insulate the battery and to check this insulation for reasons of personal safety with an insulation monitor. Indeed, if upon a first defect there is no risk for the user, it is appropriate to alert him of this first defect before the appearance of a second defect having the effect of disconnecting the traction battery since this causes a short-circuit between the positive and negative terminals of the battery. Moreover, upon this second defect, the voltage of the battery would be directly linked to the vehicle's mechanical mass and the user would therefore be potentially in contact with the latter. On account of the potential risk of such an energy source for users, the insulation and the monitoring of the insulation between the battery and the mechanical mass must be particularly meticulous. Any conducting part of the vehicle must be insulated with respect to the masses. This insulation is effected through the use of insulating materials. The insulation may deteriorate with time (because of vibrations, mechanical knocks, dust, etc.), and therefore connect the mechanical mass to a dangerous potential.

Moreover, it is conceivable to use a charger that is not galvanically insulated from the electrical network. The mechanical mass of the vehicle being normatively grounded during recharges and the neutral regime used conventionally (EE regime) residentially connecting the neutral to the earth, this amounts to connecting the mechanical mass of the vehicle to one of the potentials of the battery during recharges. During these recharges, the complete voltage of the battery is therefore applied across the terminals of the insulation in contradistinction to the nominal case where only half this voltage is applied and above all monitored. This insulation might not be capable of coping with the complete voltage creating a second defect instantaneously resulting in a short-circuit.

An electric vehicle according to the prior art typically exhibits a battery intended for the power supply of a three-phase electric motor. The battery comprises electrochemical accumulators. A protection device furnished with fuses is connected to the terminals of the battery. An insulation monitoring device is also connected to the terminals of the battery and linked up to the mechanical mass of the vehicle. The insulation monitoring device is connected to a computer to signal the insulation defects detected to it. This computer is powered by an onboard network battery. The terminals of the battery apply voltages $+V_{bat}$ and $-V_{bat}$ to the DC inputs of an inverter by way of a cutoff system. The cutoff system comprises power contactors controlled by the computer. The electric motor is connected to the AC output of the inverter. Various types of insulation monitoring are known from the prior art.

Document FR2671190 describes, in particular, a device for monitoring insulation of a DC voltage electrical network. This document describes a resistive bridge injecting an AC component (about 30 V) at low frequency (between 4 and 10 Hz). A detection circuit measures a current passing through an insulation impedance and a measurement resistor down to ground. The design of such a circuit involves a compromise in the rating of the resistors of the resistive bridge.

The resistive bridge induces an electrical consumption that remains relatively significant so as to retain appropriate measurement precision. Such current consumption may turn out to be incompatible with an application in onboard systems, for example on account of the decrease in autonomy of an electric vehicle. Moreover, such a device is relatively expensive in particular on account of the use of a low-frequency generator rated for a high DC voltage. Furthermore, the detection circuit allows only the detection of an insulation defect between one of the terminals and ground, but not the detection of an insulation defect between the other terminal and ground. Moreover, such a monitoring device is sensitive to false positives which are manifested by untimely detections since it detects an insulation defect when AC currents pass through common-mode capacitors present in the inverter.

In another solution usually implemented in an electric vehicle 1, the insulation monitoring device comprises a resistive voltage divider. A bidirectional optocoupler is connected between the midpoint of the voltage divider and the mechanical mass. The resistors of the voltage divider on either side of the midpoint are identical. Thus, in the absence of an insulation defect, the voltage across the terminals of the optocoupler is zero and no insulation defect is signaled. Upon the appearance of an insulation defect between one of the terminals of the battery and the mechanical mass, the potential of the midpoint of the voltage divider is shifted. A voltage then appears across the terminals of the optocoupler, thereby generating an insulation defect signal.

With regulations imposing a relatively low threshold of leakage current to be detected, the resistors present in the voltage divider must exhibit a relatively restricted value, on the order of 50 kΩ. These resistors then induce a relatively significant DC electrical consumption to the detriment of the autonomy provided by the battery.

The chart of FIG. 14 illustrates the leakage current for a minimum battery voltage (in this instance of 192 V) as a function of insulation resistance, for various values of resistances between the terminals and the midpoint. It is noted that a value of the resistances of 10 kΩ makes it possible for example to detect insulation defect resistances of less than 50 kΩ, while a value of the resistances of 56 kΩ makes it possible to detect insulation defect resistances of less than only 1 kΩ.

Furthermore, on account of aging, certain insulation materials may turn out to be appropriate to withstand the voltage between the mechanical mass and a terminal of the battery under normal operation, but may blow when they are subjected to the total voltage between the terminals of the battery on account of an insulation defect. Such a monitoring device does not make it possible to test and to detect a potential insulation defect such as this, and this may lead to chain insulation defects. A first insulation defect on one polarity applies the total voltage between the other polarity and the ground. If the insulation of this other polarity was not able to withstand it, the second insulation defect appears. This creates a short-circuit with fusing of the fuses. This corresponds to a loss of traction and then sudden immobilization of the vehicle, which is dangerous.

Moreover, such an insulation monitoring device makes it possible to detect the insulation defect, but not to determine its magnitude.

SUMMARY

The invention is aimed at solving one or more of these drawbacks. The invention thus pertains to an electrical power supply device, comprising:
- a DC voltage source liable to induce electrocution;
- a device for detecting an insulation defect of the DC voltage source, comprising:
  first and second input terminals connected to the terminals of the voltage source;
  a first circuit connected between the first input terminal and an intermediate point;
  a second circuit connected between the second input terminal and said intermediate point;
  an insulation defect current-detection circuit connected between an electrical ground and said intermediate point.

The first and second circuits are current limiters configured to selectively open and close the connection between their respective input terminal and the intermediate point, each of the current limiter circuits being rated so as to be traversed by a current of less than a standardized safety threshold when the first or the second current limiter circuit is closed and one of the terminals of the DC voltage source is short-circuited to the electrical ground.

A control circuit is configured to simultaneously keep one of the current limiter circuits open and the other of the current limiter circuits closed.

According to a variant, each of the current limiter circuits comprises an optocoupler controlled by the control circuit so as to selectively open and close the connection in its respective current limiter circuit.

According to a further variant, the device comprises a first capacitor connected in parallel with the first current limiter circuit between the first input terminal and the electrical ground, a second capacitor connected in parallel with the second current limiter circuit between the second input terminal and the electrical ground, the control circuit being configured to detect the discharging of one of the capacitors upon the closing of the connection of one of the current limiter circuits.

According to another variant, the control circuit closes each of the current limiter circuits in a repeated manner with a time interval of between 10 and 30 seconds.

According to yet another variant, the control circuit keeps the current limiter circuits closed with a duty ratio of less than 2%.

According to a variant, the current-detection circuit comprises a microcontroller comprising an input terminal receiving the insulation defect current originating from the intermediate point, the input terminal being connected to a power supply by way of a first resistor, the input terminal being moreover electrically grounded by way of a second resistor, the power supply being at a voltage level at least ten times lower than the voltage level of the DC voltage source, the microcontroller being configured to determine the amplitude of an insulation defect as a function of the voltage applied to its input terminal.

According to a further variant, each current limiter circuit comprises:
  a first transistor comprising an input electrode connected to a respective input terminal of the detection device, an output electrode and a control electrode;
  a first resistor connected between the input electrode and the control electrode;
  a second resistor connected between the output electrode and the intermediate point;
  an element for limiting the voltage level on the control electrode.

According to another variant, the first transistor is a MOSFET transistor.

According to a further variant, the element for limiting the voltage level is a Zener diode connected between the control electrode of the first transistor and the intermediate point.

According to yet another variant, the element for limiting the voltage level is a bipolar transistor whose base is connected to the output electrode of the first transistor, whose emitter is connected to the intermediate point and whose collector is connected to the control electrode of the first transistor.

According to yet another variant, each of the current limiter circuits is rated so as to be traversed by a current of less than 3.5 mA when the first or the second current limiter circuit is closed and one of the terminals of the DC voltage source is short-circuited to the electrical ground.

According to a variant, each of the current limiter circuits is rated so as, when the control circuit applies a closing command to it, to remain closed when it is traversed by a current induced by a short-circuit between one of the terminals of the DC voltage source and the electrical ground.

The invention also pertains to a motorization system, comprising:

an electrical power supply device such as described hereinabove, in which the DC voltage source is a battery;

an inverter exhibiting a DC interface and an AC interface, the terminals of the battery being connected to the DC interface;

an electric motor connected to the AC interface of the inverter.

According to a variant, the voltage across the terminals of the battery is greater than 100 V.

The invention furthermore pertains to an automotive vehicle comprising a motorization system such as described hereinabove.

BRIEF DESCRIPTION OF THE DRAWINGS

Other characteristics and advantages of the invention will emerge clearly from the description thereof given hereinafter, by way of wholly nonlimiting indication, with reference to the appended drawings, in which:

FIGS. 3 and 4 illustrate the configurations of the insulation defect detection device during two monitoring phases;

FIG. 5 is an electrical diagram of a first variant of a current limiter;

FIG. 6 is an electrical diagram of a second variant of a current limiter;

FIG. 7 is an electrical diagram of a third variant of a current limiter;

FIG. 8 is an electrical diagram of a fourth variant of a current limiter;

DETAILED DESCRIPTION

The invention proposes an electrical power supply device furnished with a device for detecting an insulation defect of a DC voltage source liable to induce electrocution. This device comprises first and second input terminals intended to be connected to the terminals of the voltage source. A first circuit is connected between the first input terminal and an intermediate point; a second circuit is connected between the second input terminal and the intermediate point. An insulation defect current-detection circuit is connected between an electrical ground and the intermediate point.

The first and second circuits are current limiters configured to selectively open and close the connection between their respective input terminal and the intermediate point. A control circuit is configured to simultaneously keep one of the current limiter circuits open and the other of the current limiter circuits closed.

The invention thus makes it possible to detect the appearance of an insulation defect on the two terminals of the source, with restricted current consumption and by simple means. Furthermore, the invention makes it possible to detect an insulation defect by applying the whole of the source potential difference to the terminals of the insulators during a test. It is therefore possible to preventively determine a risk of insulation defect by dielectric breakdown. The invention furthermore makes it possible to dispense with the injection of a low-frequency AC component at the terminals of the DC voltage source. The invention moreover makes it possible to improve the sensitivity of detection, without impairing the protection of users.

This invention furthermore runs counter to a technical prejudice of the person skilled in the art of producing insulation defect detection devices, according to which the use of active hardware components does not make it possible to ensure satisfactory reliability and therefore sufficient protection of users.

The usually recognized definition (for example provided by technical specification 162 published by the company Schneider Electric in September 1998) for a current limiter is a device that, during a short-circuit, allows passage of a current that is markedly lower in amplitude than the presumed current, this being based on the current that it allows through in the absence of a short-circuit. In what follows, the expression "current limiter" will designate a hardware component or circuit exhibiting a substantially constant impedance when the voltage across its terminals is less than a saturation voltage, and an impedance proportional to the voltage across its terminals when this voltage is greater than the saturation threshold. This property can be exploited to ensure good measurement sensitivity under the saturation voltage, and then to ensure sufficient protection of users above the saturation voltage.

Figure 1:
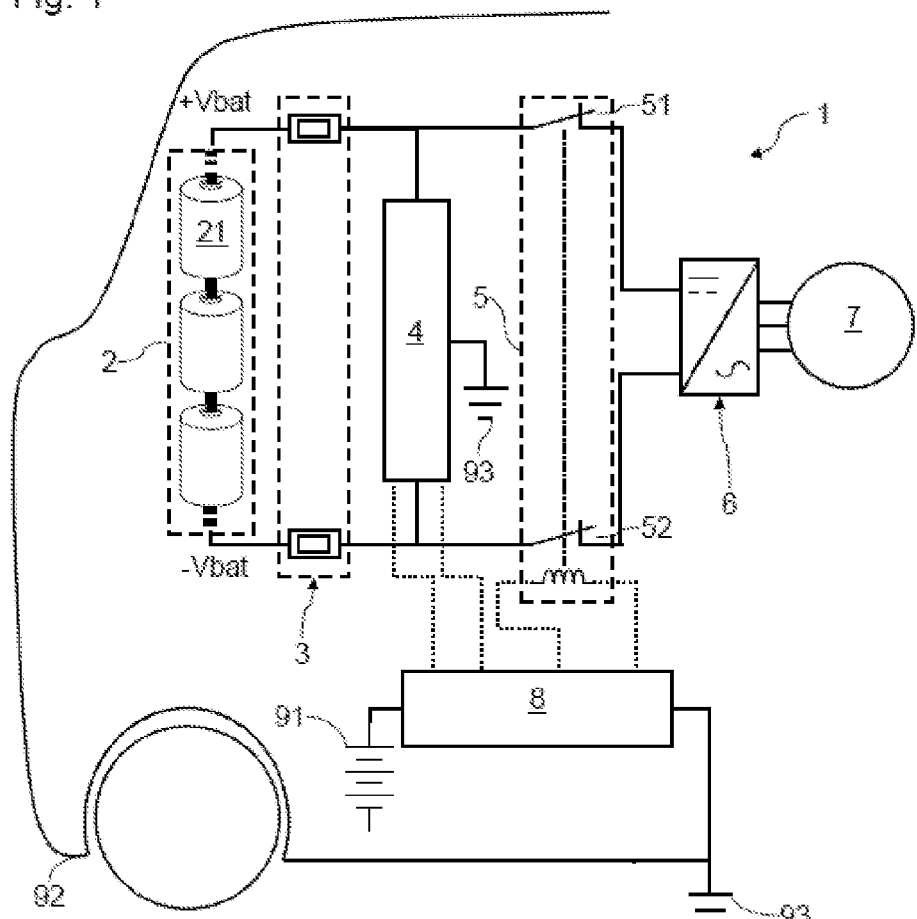
FIG. 1 is a schematic representation of an exemplary vehicle with an electric motor powered by battery.

FIG. 1 illustrates an exemplary vehicle 1 implementing an embodiment of the invention. The vehicle 1 is an electric vehicle comprising a battery 2 that includes electrochemical accumulators 21 connected in series. The battery 2 comprises a large number of accumulators 21 connected in series, typically between 40 and 150 accumulators, depending on the voltage required and the type of accumulators used. The voltage across the terminals of the charged battery 2 is typically on the order of 400 V. The battery 2 applies a voltage $+V_{bat}$ to a first terminal, and a voltage $-V_{bat}$ to a second terminal. The accumulators 21 are connected in series by way of electrical power connections. The terminals of the battery 2 are connected to a DC interface of an inverter 6. An electric motor 7 is connected to an AC interface of the inverter 6.

The connection between the terminals of the battery 2 and the DC interface of the inverter 6 is effected by way of a protection circuit 3 and by way of a power coupling circuit 5. The protection circuit 3 can comprise fuses configured to open the connection during a short-circuit. The power coupling circuit 5 comprises breakers 51 and 52 making it possible to selectively connect/disconnect the terminals of the battery 2 to the DC interface of the inverter 6. The opening/closing of the breakers 51 and 52 is controlled by a control circuit 8, typically a computer for supervising the operation of the battery 2. The control circuit 8 is typically powered by way of a battery 91 for supplying the onboard network of the vehicle 1, exhibiting a much lower voltage level than that of the battery 2. The control circuit 8 is typically connected to the mechanical mass 93, including the metal chassis and bodyshell 92 of the vehicle 1.

Figure 2:
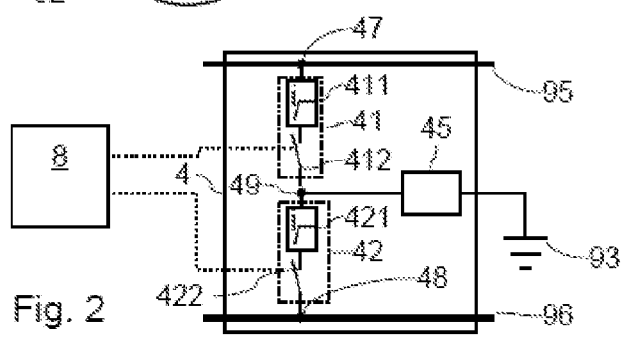
FIG. 2 is a schematic representation of an embodiment of an insulation defect detection device for an electrical power supply device.

A device for detecting an insulation defect 4 is connected to the terminals of the battery 2 and to the mechanical mass 93. An embodiment of such a detection device 4 is detailed schematically in FIG. 2. The detection device 4 comprises input terminals 47 and 48 to which the voltages $+V_{bat}$ and $-V_{bat}$ are respectively applied by way of the power connections 95 and 96. The detection device 4 comprises an intermediate point 49. An insulation defect current-detection circuit 45 is connected between the intermediate point 49 and the mechanical mass 93. A current-limiting circuit 41 is connected between the input terminal 47 and the intermediate point 49. As illustrated, the circuit 41 exhibits a current-limiting function 411, rated to limit the current passing through the circuit 41 to a value below a safety threshold fixed by standards for insulation defect currents, for example 3.5 milli-amperes. The circuit 41 furthermore exhibits a breaker function 412 making it possible selectively to open and to close the connection between the input terminal 47 and the intermediate point 49. The opening/closing of the breaker function 412 is controlled by the control circuit 8.

A current-limiting circuit 42 is connected between the input terminal 48 and the intermediate point 49. The circuit 42 exhibits a current-limiting function 421, rated to limit the current passing through the circuit 42 to a value below a safety threshold fixed by standards for insulation defect currents, for example 3.5 milliamperes. The circuit 42 furthermore exhibits a breaker function 422 making it possible selectively to open and to close the connection between the input terminal 48 and the intermediate point 49. The control circuit 8 controls the opening and closing of the breaker function 422.

The current-limiting functions 411 and 421 will advantageously be rated so that for a zero insulation defect resistance, the current passing through them during the closing of the breaker function 412 or 422 is less than a safety value Imax. In this case, the value $I_{max}$ is defined by $I_{max}=V_b/Z_{max}$, with $V_b$ the nominal voltage of the battery and $Z_{max}$ the impedance of the current-limiting function when the voltage $V_b$ is applied across its terminals. $I_{max}$ will be able to be less than or equal to 10 mA, less than 5 mA, less than or equal to 3.5 mA or less than or equal to 2 mA.

As illustrated in FIG. 3, to test the insulation between the $+V_{bat}$ terminal of the battery 2 and the mechanical mass 93, the control circuit 8 opens the breaker function in the current-limiting circuit 41 and closes the breaker function in the current-limiting circuit 42. The current-detection circuit 45 is then connected in series with the current-limiting circuit 42 between the $-V_{bat}$ terminal and the mechanical mass 93. In the case of insulation defect on the $+V_{bat}$ side, a circuit forms by way of the insulation defect between the $+V_{bat}$ terminal and the ground 93. The insulation defect current passing through the circuit 45 may be a linear function of the amplitude of the insulation defect, but this insulation defect current is limited by the circuit 42. When the value of the insulation defect resistance is sufficiently high, the insulation defect current passing through the closed limiting circuit 42 is less than the limit of current defined by this limiting circuit.

As illustrated in FIG. 4, to test the insulation between the $-V_{bat}$ terminal of the battery 2 and the mechanical mass 93, the control circuit 8 opens the breaker function in the current-limiting circuit 42 and closes the breaker function in the current-limiting circuit 41. The current-detection circuit 45 is then connected in series with the current-limiting circuit 41 between the $+V_{bat}$ terminal and the mechanical mass 93. In the case of insulation defect on the $-V_{bat}$ side, a circuit forms by way of the insulation defect between the terminal $-V_{bat}$ and the ground 93. The insulation defect current passing through the circuit 45 may be a linear function of the amplitude of the insulation defect, but this insulation defect current is limited by the circuit 41. When the value of the insulation defect resistance is sufficiently high, the insulation defect current passing through the closed limiting circuit is less than the limit of current defined by this limiting circuit.

FIG. 5 illustrates a first variant of a current-limiting function 411 (the person skilled in the art may of course effect a similar current-limiting function 421). This current-limiting function 411 comprises an NPN bipolar transistor TB11 whose collector is connected to the terminal 47. A bias resistor R1 is connected between the collector and the base of the transistor TB11. A resistor R2 is connected between the emitter of the transistor TB11 and the intermediate point 49. A Zener diode DZ1 is connected between the intermediate point and the base of the transistor TB11.

The Zener diode DZ1 makes it possible to maintain a substantially constant voltage between the base and the intermediate point 49. The bias resistor R1 makes it possible to turn on the transistor TB11 in the presence of a current between the terminal 47 and the intermediate point 49 and to bias DZ1. The maximum current $I_{max}$ corresponds substantially to the current passing through the transistor TB11 and can therefore be expressed by the following relation:

$$I_{max}=(Vz-V_{be})/R2$$

with Vz being the breakdown voltage of the Zener diode, $V_{be}$ being the voltage between the base and the emitter of transistor TB11, and R2 the value of the resistor R2.

The function of the resistor R1 is to limit to the maximum the current in this branch while being able to bias the transistor TB11 and the Zener diode DZ1. For this purpose, the resistor R1 will advantageously be able to exhibit a resistance of between 100 kΩ and 5 MΩ. The diode DZ1 will advantageously exhibit a breakdown voltage of between 5 and 20 V, for example 15V. With such values, the resistor R2 will typically exhibit a value of 7 kΩ so as to limit the maximum current passing through the circuit 41 to 2 mA during an insulation defect short-circuit.

FIG. 6 illustrates a second variant of a current-limiting function 411. This current-limiting function comprises an NPN bipolar transistor TB11 whose collector is connected to the terminal 47. A bias resistor R1 is connected between the collector and the base of the transistor TB11. A resistor R2 is connected between the emitter of the transistor TB11 and the intermediate point 49. An NPN bipolar transistor TB12 has its collector connected to the base of the transistor TB11, its base connected to the emitter of the transistor TB11, and its emitter connected to the intermediate point 49.

The maximum current $I_{max}$ corresponds substantially to the current passing through the transistor TB11 and can therefore be expressed by the following relation:

$$I_{max}=(V_{be})/R2$$

where $V_{be}$ is the base/emitter voltage of the transistor TB12.

FIG. 7 illustrates a third variant of a current-limiting function 411. This current-limiting function comprises a MOSFET transistor TC11 whose drain is connected to the terminal 47. A bias resistor R1 is connected between the drain and the gate of the transistor TC11. A resistor R2 is connected between the source of the transistor TC11 and the intermediate point 49. A Zener diode DZ1 is connected between the intermediate point and the gate of the transistor TC11.

The Zener diode DZ1 makes it possible to maintain a substantially constant voltage between the gate and the intermediate point 49. The bias resistor R1 makes it possible to turn on the transistor TC11 in the presence of a current between the terminal 47 and the intermediate point 49. The maximum current $I_{max}$ corresponds substantially to the current passing through the transistor TC11 and can therefore be expressed by the following relation:

$$I_{max}=(V_z-V_{gsth})/R_2$$

with $V_z$ being the breakdown voltage of the Zener diode, $V_{gsth}$ being the gate/source threshold voltage of the transistor TC11, and $R_2$ being the value of the resistor R2.

FIG. 8 illustrates a fourth variant of a current-limiting function 411. This current-limiting function comprises a MOSFET transistor TC11 whose drain is connected to the terminal 47. A bias resistor R1 is connected between the drain and the gate of the transistor TC11. A resistor R2 is connected between the source of the transistor TC11 and the intermediate point 49. An NPN bipolar transistor TB12 has its collector connected to the gate of the transistor TC11, its base connected to the source of the transistor TC11, and its emitter connected to the intermediate point 49.

The maximum current $I_{max}$ corresponds substantially to the current passing through the transistor TC11 and can therefore be expressed by the following relation:

$$I=(V_{be})/R_2$$

with $V_{be}$ being the base/emitter voltage of the transistor TB12.

The current sources presented with NPN transistors and N-channel MOSFETs can also be embodied with PNP transistors and P-channel MOSFETs.

Even if the current-limiting functions described reach saturation and do not make it possible to determine the amplitude of the insulation defect current beyond a certain threshold, this is not detrimental to the operation of the detection device 4, the latter still retaining its function of detecting the appearance of the insulation defect and optionally of analyzing its initial evolution.

In the variants of FIGS. 5 to 8, the breaker function 412 is in the test configuration and therefore closed. The current-limiting function 411 is therefore illustrated connected between the terminal 47 and the intermediate point 49.

Figure 9:
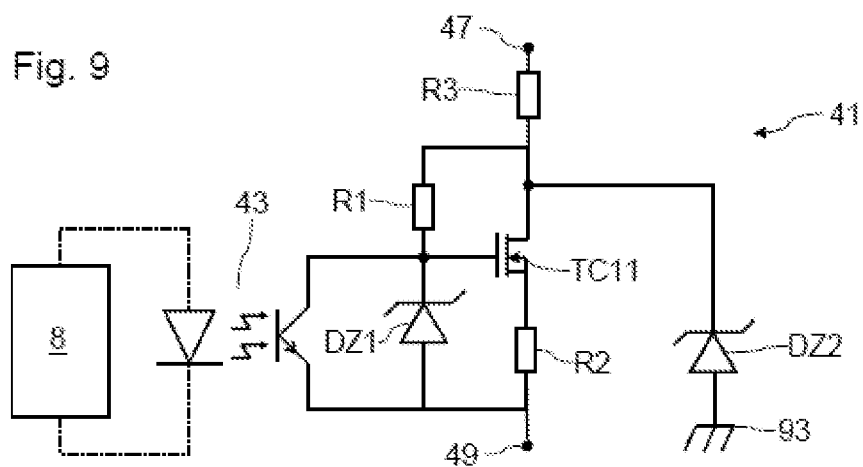
FIG. 9 is an electrical diagram of an enhancement applied to the third variant.

FIG. 9 illustrates an exemplary current-limiting circuit 41 integrating a current-limiting function 411 according to the third variant. The current-limiting circuit 41 comprises a breaker embodied in the form of an optocoupler 43. The optocoupler 43 comprises a phototransistor whose collector is connected to the gate of the transistor TC11 and whose emitter is connected to the intermediate point 49.

A protection resistor R3 is connected between the drain of the transistor TC11 and the terminal 47. A protection Zener diode DZ2 is connected between the drain of the transistor TC11 and the mechanical mass 93. This serves for protection against overvoltages arising from the network, in particular when using a non-insulated charger to improve the robustness of the system.

The breaker function of the current-limiting circuit 41 is here effected by means of the optocoupler 43. By an appropriate command, the control circuit 8 turns the phototransistor of the optocoupler 43 on or off. In the "on" state, the phototransistor keeps the transistor TC11 turned off, thus ensuring an open-breaker function. The breaker function makes it possible to close the current-limiting circuits 41 and 42 alternately. Indeed, as it is tricky to produce circuits 41 and 42 with sufficiently similar properties, simultaneous closing of the circuits 41 and 42 could induce an imbalance at the level of the intermediate point 49 and thus erroneous detection of insulation defect. Moreover, the breaker function also makes it possible to limit the current consumption of the detection device 4 outside of a test phase: by keeping the circuits 41 and 42 open with a high duty ratio, the consumption of the detection device 4 is particularly restricted. Each circuit 41 or 42 will advantageously be closed with a frequency of less than 0.1 Hz (time intervals for example of between 10 and 30 seconds) and with a duty ratio of closing of the circuits 41 and 42 of preferably less than 2% during operation of the DC voltage source.

The current-limiting circuits 41 and 42 will advantageously be rated so as to remain closed when the control circuit applies a closing command to them, even when they are traversed by a current for an insulation defect corresponding to a short-circuit between a terminal and the ground. This rating will be able to be achieved as a function of the closing duty ratio that is applied to them by the control circuit 8.

The drawback of the solution of FIG. 9 is that it induces consumption in the optocoupler 43 to keep the transistor TC11 turned off. The solution of FIG. 10 proposes an alternative that makes it possible to eliminate this current consumption when the current-limiting circuit 41 is open. The current-limiting circuit 41 comprises an optocoupler 43. The optocoupler 43 comprises a phototransistor whose collector is connected to the resistor R2 and whose emitter is connected to the intermediate point 49.

The breaker function of the current-limiting circuit 41 is here also effected by means of the optocoupler 43. By an appropriate command, the control circuit 8 turns the phototransistor on or off. In the "off" state, the phototransistor keeps the transistor TC11 turned off, thus ensuring an open-breaker function. In the "on" state, the current passing through the transistor TC11 can pass through the phototransistor. As in the example of FIG. 9, the breaker function makes it possible to close the current-limiting circuits 41 and 42 alternately.

Figure 15:
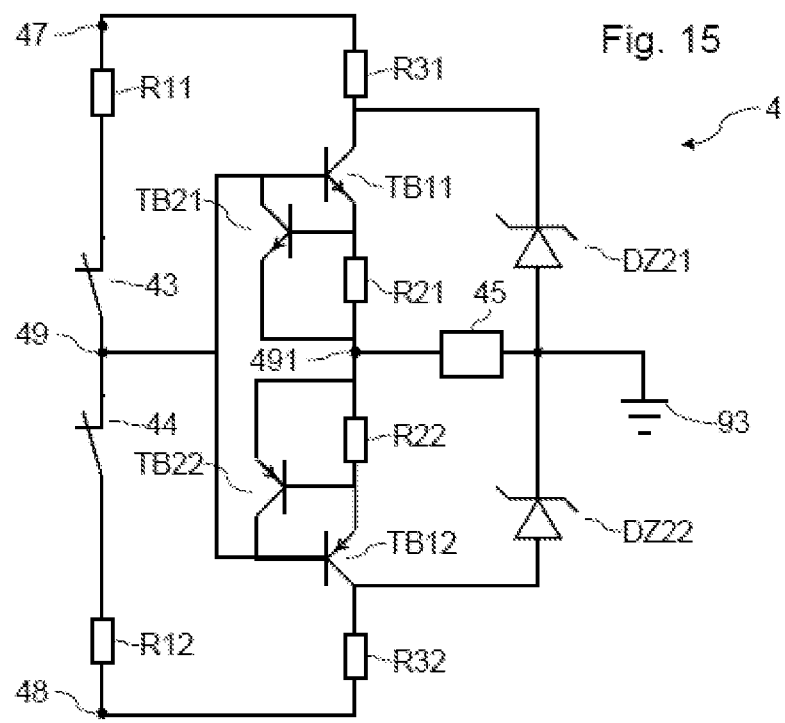
FIGS. 15 and 16 are electrical diagrams of an insulation defect detection circuit including variants of current limiters.

FIG. 15 illustrates a variant of the detection device 4 furnished with an insulation defect current limiter circuit combined with a circuit for amplifying this current. In this variant, the circuit for amplifying the leakage current is embodied on the basis of bipolar transistors.

The detection device 4 comprises a first impedance R11 and a second impedance R12 (in this instance resistors) connected in series between the first terminal 47 and the second terminal 48. The impedances R11 and R12 are connected by way of the intermediate point 49 and are preferably of substantially identical values. A first breaker 43 is connected in series with the first impedance R11 between the terminal 47 and the intermediate point 49. A second breaker 44 is connected in series with the second impedance R12 between the second terminal 48 and the intermediate point 49. The breakers 43 and 44 are, in this instance, MOSFET transistors. Other types of controlled breakers can of course be used. The control circuit 8 controls the respective opening and closing of the breakers 43 and 44. The control circuit 8 keeps the breaker 43 open when it undertakes the closing of the breaker 44 during a test phase, and vice versa.

The amplification circuit comprises an NPN bipolar transistor TB11 whose base is connected to the intermediate point 49, an NPN bipolar transistor TB21 whose collector is connected to the intermediate point 49, whose base is connected to the emitter of the transistor TB11, and whose emitter is connected to the input 491 of the detection circuit 45. A gain resistor R21 is connected between the base and the emitter of the transistor TB21. A protection resistor R31 is advantageously connected between the collector of the transistor TB11 and the terminal 47.

The amplification circuit also comprises a PNP bipolar transistor TB12 whose base is connected to the intermediate point 49, a PNP bipolar transistor TB22 whose collector is connected to the intermediate point 49, whose base is connected to the emitter of the transistor TB12, and whose emitter is connected to the input 491 of the detection circuit 45. A gain resistor R22 is connected between the base and the emitter of the transistor TB22. A protection resistor R32 is advantageously connected between the collector of the transistor TB12 and the terminal 48.

The amplification circuit advantageously furthermore comprises Zener diodes DZ21 and DZ22 connected respectively between the collector of TB11 and the mechanical mass 93, and between the collector of TB12 and the mechanical mass 93.

The transistors TB11 and TB12 are intended to amplify the current passing through the impedances R11 and R12 so as to increase the measurement range. The transistors TB21 and TB22 are intended to limit the insulation defect current so as to ensure the protection of users. It is not possible with impedances R11 and R12 alone to have at one and the same time an extended measurement range and satisfactory protection of users. The protection resistors R31 and R32 as well as the Zener diodes DZ21 and DZ22 make it possible to protect the transistors TB11, TB12, TB21 and TB22 of the amplification circuit against overvoltages, in particular, when using a non-insulated charger that directly applies the overvoltages arising from the network.

Figure 16:
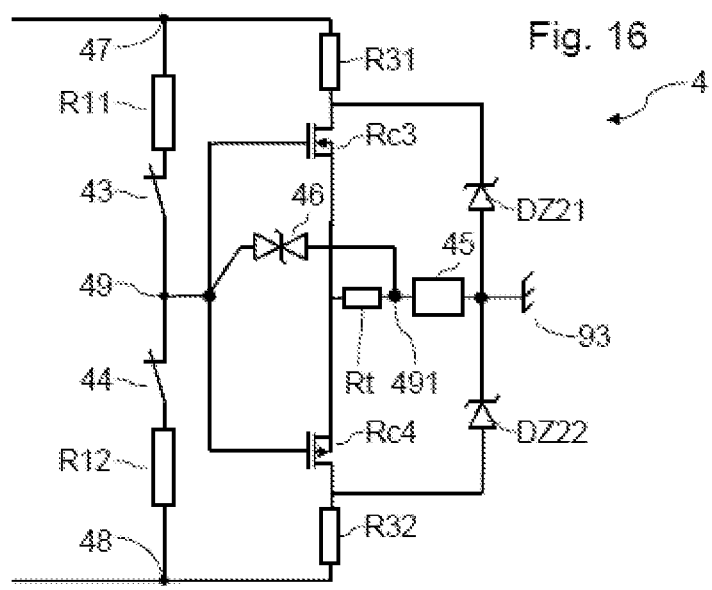

FIG. 16 illustrates another variant of the detection device 4 furnished with an insulation-defect current limiter circuit combined with a circuit for amplifying this current. In this variant, the circuit for amplifying the leakage current is embodied on the basis of MOS transistors.

The detection device 4 comprises a first impedance R11 and a second impedance R12 connected in series between the first terminal 47 and the second terminal 48. The impedances R11 and R12 are connected by way of the intermediate point 49 and are preferably of substantially identical values. A first breaker 43 is connected in series with the first impedance R11 between the terminal 47 and the intermediate point 49. A second breaker 44 is connected in series with the second impedance R12 between the second terminal 48 and the intermediate point 49. The control circuit 8 controls the respective opening and closing of the breakers 43 and 44. The control circuit 8 keeps the breaker 43 open when it undertakes the closing of the breaker 44 during a test phase, and vice versa.

The amplification circuit comprises a pair of Zener diodes 46 mounted in series head-to-tail or a bidirectional Zener diode between the intermediate point 49 and the input 491 of the detection circuit 45.

The amplification circuit comprises an N-channel MOS transistor Rc3 whose gate is connected to the intermediate point 49. The amplification circuit advantageously also comprises a protection resistor R31 connected between the terminal 47 and the drain of the transistor Rc3.

The amplification circuit comprises a P-channel MOS transistor Rc4 whose gate is connected to the intermediate point 49. The amplification circuit advantageously also comprises a protection resistor R32 connected between the terminal 48 and the drain of the transistor Rc4.

The amplification circuit comprises a current attenuation resistor Rt connected between the input 491 and the source of the transistors Rc3 and Rc4.

The amplification circuit advantageously furthermore comprises Zener diodes DZ21 and DZ22 connected respectively between the drain of the transistors Rc3 and Rc4 and the mechanical mass 93. These protect the circuit from overvoltages, in particular when using a non-insulated charger which directly applies the overvoltages arising from the network. The bidirectional Zener diode (or the head-to-tail diode pair) 46 makes it possible to limit the current through the detection circuit 45 to a value $I_{max}$ defined by the following relation:

$$I_{max}=(V_z-V_{gsth})/R_t$$

with Rt being the resistance value of Rt, $V_z$ being the threshold voltage of the pair or of the bidirectional Zener diode 46 (or of the head-to-tail diode pair), and $V_{gsth}$ being the potential difference between the gate and the source of one of the transistors Rc3 or Rc4.

During a test phase and in the presence of an insulation defect, the voltage on the gate of the transistor Rc3 or Rc4 is sufficient to turn it on. The current passing through the turned-on transistor passes through the resistor Rt and the detection circuit 45. Amplification of the insulation defect current applied to the input 491 of the detection circuit 45 is thus achieved. The maximum defect current is limited by the resistor Rt and the bidirectional Zener diode 46 (or the head-to-tail diode pair) for the safety of the hardware and people.

Figure 11:
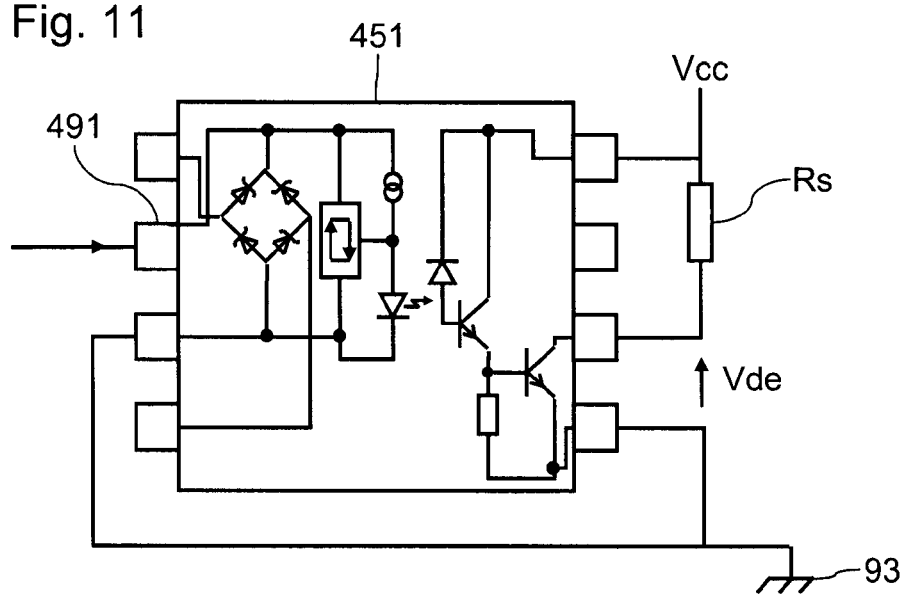
FIG. 11 is a schematic representation of a threshold-based leakage current-detection circuit.

FIG. 11 represents an exemplary detection circuit in the form of a hysteresis-type photocoupler 451 that makes it possible to detect an insulation defect current when the latter crosses a threshold. When the current at the input of 491 crosses a threshold defined for the hysteresis-type photocoupler 451, the photocoupler 451 generates a detection signal in respect of an insulation defect $V_{de}$, read by the control circuit 8.

Figure 12:
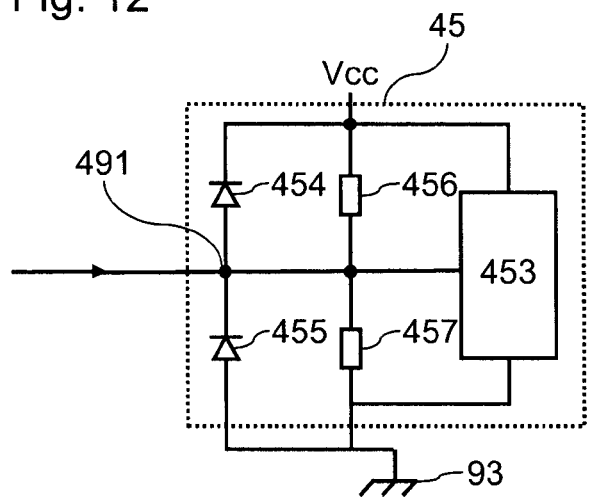
FIG. 12 is a schematic representation of a circuit for quantifying the leakage current.

FIG. 12 illustrates another example of insulation defect detection, making it possible to determine the amplitude of the insulation defect current, and thus to analyze its evolution over time. The detection circuit 45 includes a microcontroller 453. The microcontroller 453 is connected to the input 491, to the potential $V_{cc}$, and to the mechanical mass 93. The voltage $V_{cc}$ can be derived from the battery 91. A diode 454 and a resistor 456 are connected in parallel between $V_{cc}$ and the input 491. A diode 455 and a resistor 457 are connected in parallel between the mechanical mass 93 and the input 491. The resistors 456 and 457 are of the same values. With no insulation defect current, the voltage on the input 491 is at the value $V_{cc}/2$. Any defect current modifies the voltage on the input 491. As a function of the voltage value read on the input 491, the microcontroller 453 can precisely determine the amplitude of the insulation defect. The voltage value read on the input 491 can be provided to the control circuit 8.

Figure 13:
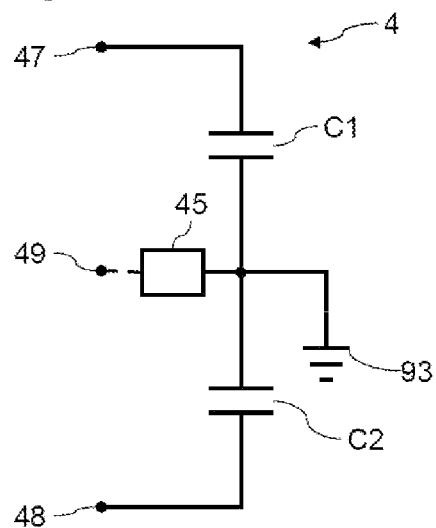
FIG. 13 is a schematic representation of an enhancement making it possible to test the detection device.
Figure 14:
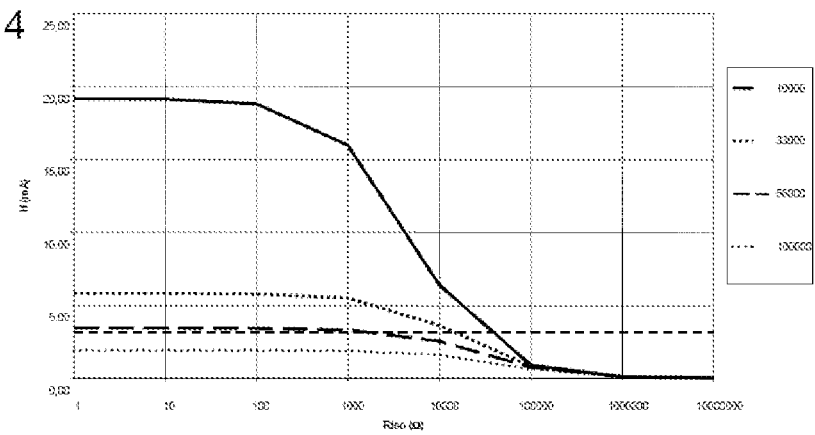
FIG. 14 is a chart illustrating various leakage currents detected as a function of the rating of resistors of the insulation defect detection device.

FIG. 13 illustrates a variant of a detection device 4 making it possible to test its operation. For this purpose, the detection device 4 comprises two capacitors C1 and C2 connected between the terminals $+V_{bat}$ and $-V_{bat}$ and the mechanical mass 93.

When the control circuit 8 closes the current-limiting circuit 41, a discharge current of the capacitor C1 passes transiently through the detection circuit 45 before the latter can measure a possible insulation defect current. The control circuit 8 can thus identify that the detection circuit 4 is functional by verifying the presence of the transient discharge current.

When the control circuit 8 closes the current-limiting circuit 42, a discharge current of the capacitor C2 passes transiently through the detection circuit 45 before the latter can measure a possible insulation defect current. The control circuit 8 can thus identify that the detection circuit 4 is functional by verifying the presence of the transient discharge current.

Such capacitors can already be integrated for other functions in the electrical architecture, for example to filter common-mode disturbances inside the inverter 6 or in an energy converter. In this case no additional hardware component is necessary. These capacitors can also be supplemented with the stray capacitances internal to the various circuits.

The discharge time of these capacitors can also serve to estimate the value of these capacitors and possibly their drift over time.

In AC electrical installations, the commonest neutral regimes are:

the EE regime, in which the neutral of the installation is grounded on the generator side and the metallic masses are grounded;

the EN regime, in which the neutral of the installation is grounded on the generator side and the metallic masses are linked to the neutral; and the IE regime, in which the neutral of the installation is insulated from the earth or linked by a high impedance on the generator side and the metallic masses are linked to a grounding outlet.

The neutral regime thus defines the way in which the neutral is linked up, on the one hand, and the way in which the masses are linked up on the user side, on the other hand. The aim of the grounding layouts is to protect people and hardware by overseeing the insulation defects.

The grounding layout for the battery 2 can be regarded as an IE neutral regime of an electrical network, that is to say a neutral insulated with respect to ground and a mechanical mass linked up to ground (except while driving, where the mechanical mass is insulated from ground by the tires). Such a grounding layout makes it possible to ensure continuity of service of the vehicle upon the appearance of a first insulation defect. The user can thus continue to control the vehicle so as to stop it under good safety conditions.

To ensure the recharging of the battery 2 by an electrical network, an AC insulated charger connected to the network is generally linked up. In this case the IE regime is retained. On the other hand, a galvanically insulated charger is more expensive than a non-insulated charger. With a non-insulated charger, the EE regime exists during charging, this amounting to connecting ground to the potential $-V_{bat}$ of the battery 2 during the positive alternations of the electrical network. A current then travels through ground during these alternations.

To avoid a false positive by the detection device 4 during rapid charging of the battery, the insulation monitoring on the $-V_{bat}$ terminal of the battery 2 is then deactivated by opening the two breakers 41 and 42.

Figure 10:
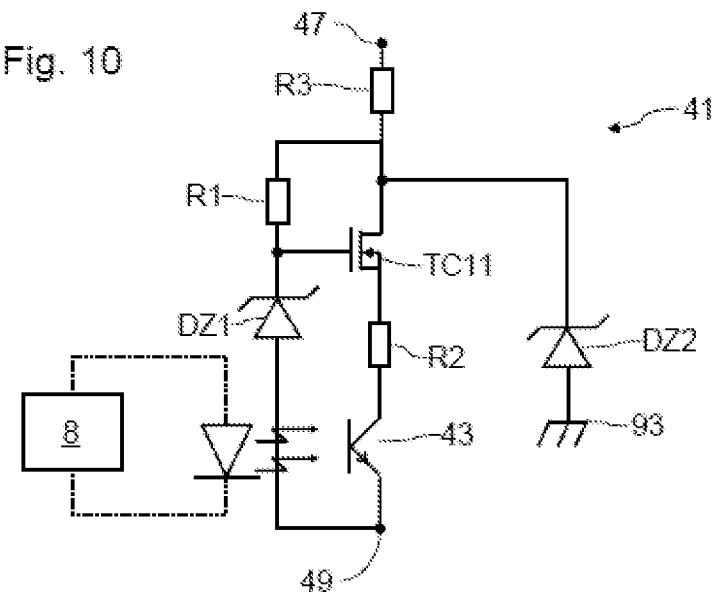
FIG. 10 is an electrical diagram of a fifth variant of a current limiter.

In the examples illustrated in FIGS. 9 and 10, the current-limiting circuit 41 is protected from possible overvoltages that may be induced by a non-insulated charger, by way of the resistor R3 and by way of the Zener diode or TRANSIL™ diode DZ2. The rules for rating these protection hardware components may be as follows. With a battery 2 whose nominal voltage is 400 V, it will be possible to use hardware components of the current-limiting function 411 that are designed to resist voltages of 600 V. If it is desired to protect the limiting circuit 41 against an overvoltage of 4 kV (which may for example be due to the effect of lightning on the power supply network of a non-insulated charger), the voltage across the terminals of the diode DZ2 must therefore remain less than 600 V. For such an overvoltage, the voltage across the terminals of the resistor R3 will therefore be 3.4 kV. With a diode DZ2 rated for a power of 600 W, the current passing through it must be less than 1 A. Consequently, the resistor R3 must have a value at least equal to 3.4 kΩ.

If the transistor TC11 withstands the overvoltage energy in avalanche mode, it is possible to dispense with the use of the diode DZ2.

The resistor R3 is also useful for limiting the current under the assumption that the transistor TC11 is destroyed. Although these protections have been described in combination with the solution of the third variant, these protections are of course usable in the first, second and fourth variants.

The invention claimed is:

1. An apparatus comprising an electrical power supply device, said electrical power supply device comprising a DC voltage source providing a voltage that is liable to induce electrocution, said DC voltage source comprising terminals, a controller, and an insulation-defect detecting device for detecting an insulation defect of said DC voltage source, wherein said insulation-defect detecting device comprises first and second input terminals connected to said terminals of said voltage source, a first circuit connected between said first input terminal and an intermediate point, a second circuit connected between said second input terminal and said intermediate point, and an insulation-defect current-detection circuit connected between an electrical ground and said intermediate point, wherein said first circuit comprises a first current limiter circuit that is configured to selectively open and close a connection between input terminals of said first circuit and said intermediate point, wherein said second circuit comprises a second current limiter circuit that is configured to selectively open and close a connection between input terminals of said second circuit and said intermediate point, wherein said first current limiter circuit is rated to be traversed by a current of less than a standardized safety threshold when said first current limiter circuit is closed and one of said terminals of said DC voltage source is short-circuited to electrical ground, wherein said second current limiter circuit is rated to be traversed by a current of less than a standardized safety threshold when said second current limiter circuit is closed and one of said terminals of said DC voltage source is short-circuited to ground, wherein said control circuit is configured to simultaneously keep one of said current limiter circuits open and one said current limiter circuits closed.

2. The apparatus of claim 1, wherein said first current limiter circuits comprises an optocoupler (43) controlled by said control circuit so as to selectively open and close said connection in said first current limiter circuit, and wherein said second current limiter circuits comprises an optocoupler controlled by said control circuit so as to selectively open and close said connection in said second current limiter circuit.

3. The apparatus of claim 1, wherein said electrical power supply device further comprises a first capacitor connected in parallel with said first current limiter circuit between said first input terminal and electrical ground, and a second capacitor connected in parallel with said second current limiter circuit between said second input terminal and said electrical ground, wherein said control circuit is configured to detect discharging of one of said capacitors upon said closing of a connection of one of said current limiter circuits.

4. The apparatus of claim 1, wherein said control circuit closes each of said current limiter circuits in a repeated manner with a time interval of between 10 and 30 seconds.

5. The apparatus of claim 1, wherein said control circuit keeps said current-limiting circuits closed with a duty ratio of less than 2%.

6. The apparatus of claim 1, wherein said insulation-defect current-detection circuit comprises a microcontroller comprising a microcontroller input terminal configured to receive said insulation defect current originating from said intermediate point, wherein said microcontroller input terminal is connected to a power supply by way of a first resistor, wherein said microcontroller input terminal is electrically grounded by way of a second resistor, wherein said power supply is at a voltage level at least ten times lower than said voltage level of said DC voltage source, and wherein said microcontroller is configured to determine an amplitude of an insulation defect as a function of a voltage applied to said microcontroller input terminal.

7. The apparatus of claim 1, wherein said first and second current limiter circuits each comprise a first transistor comprising an input electrode connected to an input terminal of said insulation-defect detecting device, an output electrode and a control electrode, a first resistor connected between said input electrode and said control electrode, a second resistor connected between said output electrode and said intermediate point, and an element for limiting voltage level on said control electrode.

8. The apparatus of claim 7, wherein said first transistor is a MOSFET transistor.

9. The apparatus of claim 7, wherein said element for limiting said voltage level comprises a Zener diode connected between said control electrode of said first transistor and said intermediate point.

10. The apparatus of claim 7, wherein said element for limiting said voltage level comprises a bipolar transistor having base connected to said output electrode of said first transistor, an emitter connected to said intermediate point, and a collector connected to said control electrode of said first transistor.

11. The apparatus of claim 1, wherein said current limiter circuits is rated so as to be traversed by a current of less than 3.5 mA when said first or said second current limiter circuit is closed and one of said terminals of said DC voltage source is short-circuited to electrical ground.

12. The apparatus of claim 1, wherein each of said current limiter circuits is rated so as when said control circuit applies a closing command to said current limiter circuit, said current limiter circuit remains closed when traversed by a current induced by a short-circuit between one of said terminals of said DC voltage source and electrical ground.

13. The apparatus of claim 1, further comprising an inverter and an electric motor, wherein said DC voltage source comprises a battery having battery terminals, wherein said inverter comprises a DC interface and an AC interface, wherein said battery terminals of said battery are connected to said DC interface of said inverter, and wherein said electric motor is connected to said AC interface of said inverter.

14. The apparatus of claim 13, wherein said battery is configured to provide a voltage across said battery terminals that is greater than 100 V.

15. The apparatus of claim 13, further comprising an automotive vehicle connected to receive power from said battery.

* * * * *